United States Patent
Nishi et al.

(10) Patent No.: US 10,069,515 B2
(45) Date of Patent: Sep. 4, 2018

(54) DECODING DEVICE AND DECODING METHOD

(71) Applicant: KABUSHIKI KAISHA TOSHIBA, Tokyo (JP)

(72) Inventors: Yoshifumi Nishi, Kanagawa (JP); Takao Marukame, Tokyo (JP); Yuichiro Mitani, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 14/924,254

(22) Filed: Oct. 27, 2015

(65) Prior Publication Data

US 2016/0226523 A1 Aug. 4, 2016

(30) Foreign Application Priority Data

Feb. 2, 2015 (JP) .................................. 2015-018840

(51) Int. Cl.
*H03M 13/00* (2006.01)
*H03M 13/11* (2006.01)

(52) U.S. Cl.
CPC .... *H03M 13/1131* (2013.01); *H03M 13/1111* (2013.01)

(58) Field of Classification Search
CPC .......... H03M 13/1111; H03M 13/1131; H03M 13/1125; H03M 13/6597; H03M 13/1128;
(Continued)

(56) References Cited

U.S. PATENT DOCUMENTS 7,805,654 B2    9/2010  Seki
2005/0229087 A1*  10/2005  Kim ................... H03M 13/1105
                                                         714/800
(Continued)

FOREIGN PATENT DOCUMENTS

JP    2007-13519    1/2007
JP    2008-219528   9/2008
(Continued)

OTHER PUBLICATIONS

Gu, M. et al., "A 100 pJ/bit, (32,8) CMOS Analog Low-Density Parity-Check Decoder Based on Margin Propagation" IEEE Journal of Soild-State Circuits. vol. 46, No. 6. (Jun. 2011) pp. 1433-1442.

*Primary Examiner* — Guerrier Merant
(74) *Attorney, Agent, or Firm* — Finnegan, Henderson, Farabow, Garrett & Dunner, L.L.P.

(57) ABSTRACT

According to an embodiment, a decoding device includes a variable node processor, a check node processor, a first forwarder, and a second forwarder. The variable node processor is configured to perform variable node processing on variable nodes defined by a code and output first messages. The check node processor is configured to perform check node processing on check nodes defined by the code based on the first messages and output second messages. The first forwarder is configured to forward one or more first messages remaining after excluding messages to be forwarded to one or more check nodes corresponding to one or more of the second messages having been stored in ae storage, to the check nodes. The second forwarder is configured to forward the second messages to the variable nodes and forward the one or more of the second messages to the storage.

13 Claims, 11 Drawing Sheets

(58) Field of Classification Search
CPC ......... H03M 13/1134; H03M 13/6525; H03M 13/6527; H03M 13/6544; H03M 13/6552; H03M 13/6555; H03M 13/1165; G06F 11/1068; G06F 11/1012; H04L 1/005; H04L 1/0053; H04L 1/0057
See application file for complete search history.

(56) References Cited

U.S. PATENT DOCUMENTS

| | | | |
|---|---|---|---|
| 2005/0262420 A1* | 11/2005 | Park | H03M 13/6566 |
| | | | 714/758 |
| 2006/0274772 A1* | 12/2006 | Kim | H03M 13/1111 |
| | | | 370/412 |
| 2007/0094568 A1* | 4/2007 | Choi | H03M 13/1117 |
| | | | 714/758 |
| 2011/0087946 A1* | 4/2011 | Planjery | H03M 13/1117 |
| | | | 714/752 |
| 2011/0246850 A1* | 10/2011 | Rault | H03M 13/1128 |
| | | | 714/752 |
| 2012/0036410 A1* | 2/2012 | Rault | H03M 13/1128 |
| | | | 714/752 |
| 2014/0032996 A1 | 1/2014 | Maeto | |
| 2015/0178151 A1* | 6/2015 | Li | G06F 11/1044 |
| | | | 714/758 |

FOREIGN PATENT DOCUMENTS

| | | |
|---|---|---|
| JP | 2012-124888 | 6/2012 |
| JP | 2013-207358 | 10/2013 |
| JP | 2014-27432 | 2/2014 |

\* cited by examiner

FIG.3
(a)
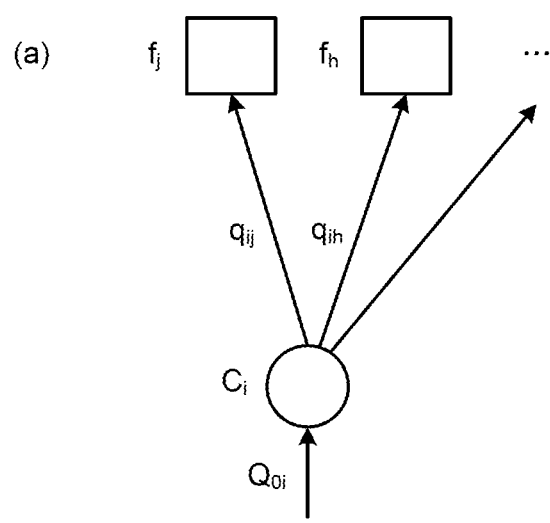
(b)
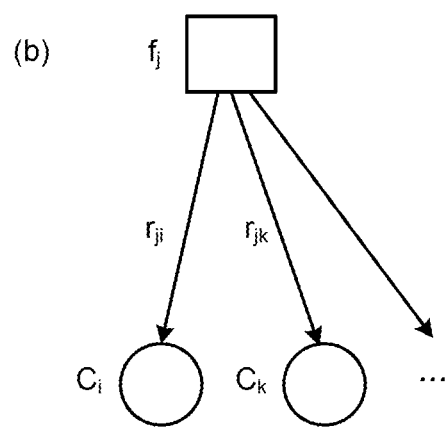

DECODING DEVICE AND DECODING METHOD

CROSS-REFERENCE TO RELATED APPLICATION

This application is based upon and claims the benefit of priority from Japanese Patent Application No. 2015-018840, filed on Feb. 2, 2015; the entire contents of which are incorporated herein by reference.

FIELD

Embodiments described herein relate generally to a decoding device and a decoding method.

BACKGROUND

An LDPC code (LDPC stands for Low-Density Parity-Check) is known as an encoding method that has a strong error correction/encoding capacity and that is used in communication systems and memory devices. An LDPC code uses a parity check matrix and repeatedly performs message value calculation called row processing and column processing; and performs decoding by obtaining the posterior probability of received-word data. From among the existing types of error correction codes, an LDPC code has the error correction capacity close to the theoretical limit. For that reason, the LDPC code is widely used in communication systems and storage devices.

Meanwhile, regarding the flash memory that, in recent years, has become mainstream as far as nonvolatile semiconductor memory devices are concerned, miniaturization of memory cells and multi-bit per cell architecture have escalated the errors occurring during reading. For that reason, the error correction capacity of the conventional BCH code (BCH stands for Bose, Chandhuri, Hocquenghem) has become insufficient. Thus, in recent years, a lot of attention is being focused on the LDPC codes having a higher error correction capacity. Besides, in order to retain the intergenerational compatibility among the error correction methods, there has been a demand for a technology providing an on-chip decoding circuit for decoding the LDPC codes. As a result of providing an on-chip decoding technology, the LDPC code decoding operation can be performed using a circuit arranged on the chip on which the semiconductor memory device is formed. As a result, the apparent error occurrence rate of the semiconductor memory device can be held down to a certain level or lower.

Meanwhile, since an LDPC code performs probability-based error correction, it becomes necessary to perform complex real number calculation. Particularly, in the check node processing performed during the calculations for decoding an LDPC code, it is necessary to perform product-sum operations of probability values, thereby requiring a large amount of calculation resources. Hence, in order to implement the decoding operation for an LDPC code using hardware, a large-scale digital semiconductor circuit is required. That makes on-chip implementation a difficult task.

In that regard, in order to downscale the semiconductor circuit that performs decoding of an LDPC code, a method has been proposed in which the real numbers are expressed as electrical current and the real number calculation is performed using analog circuitry. However, in the case of expressing data values as electrical current, electrical current must continuously flow during the data processing. That leads to consumption of an enormous amount of electrical power.

In this way, in order to achieve a sufficient error correction capacity in an LDPC code using the conventional technology, it is necessary to perform the decoding operation using real number calculation. Unfortunately, this enlarges implementation of an error correction device using a semiconductor integrated circuit.

BRIEF DESCRIPTION OF THE DRAWINGS

FIG. 3 illustrates check node processing that can be implemented according to the embodiments;

DETAILED DESCRIPTION

According to an embodiment, a decoding device includes a variable node processor, a check node processor, a storage, a first forwarder, and a second forwarder. The variable node processor is configured to perform variable node processing on variable nodes defined by a code and output first messages. The check node processor is configured to perform check node processing on check nodes defined by the code based on the first messages and output second messages. The storage is configured to store one or more of the second messages. The first forwarder is configured to forward one or more first messages remaining after excluding messages to be forwarded to one or more check nodes corresponding to the one or more of the second messages having been stored in the storage, to the check nodes. The second forwarder is configured to forward the second messages to the variable nodes and forward the one or more of the second messages to the storage.

Configurations Shared Between Embodiments

Figure 1:
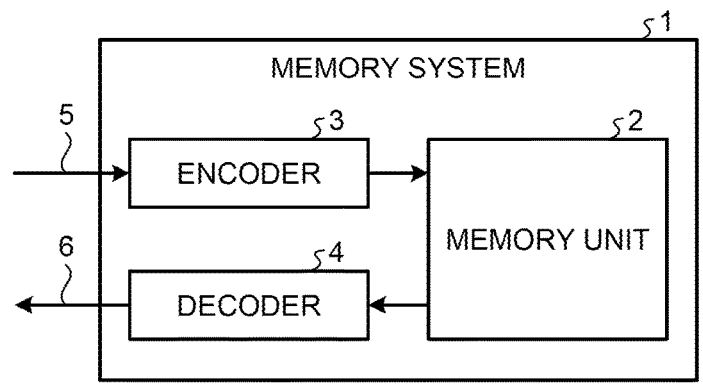
FIG. 1 is a schematic of an exemplary memory system including a decoding device according to embodiments.

A decoding device according to embodiments will now be explained. The decoding device according to the embodiments decodes LDPC codes. FIG. 1 is a schematic of an exemplary configuration of a memory system including the decoding device according to the embodiments.

With reference to FIG. 1, a memory system 1 includes a memory unit 2, an encoder 3, and a decoder 4. Firstly, input data 5 is input to the encoder 3. Then, the encoder 3 encodes the input data 5 into an LDPC code, and sends the LDPC code to the memory unit 2 that includes, for example, a controller and a memory medium. Thus, the LDPC code that is sent to the memory unit 2 is written in the memory medium by the controller. In a first embodiment, it is assumed that a flash memory is used as the memory medium.

The memory unit 2, the encoder 3, and the decoder 4 may be integrated into one semiconductor chip, but without limitation. The memory unit 2, the encoder 3, and the decoder 4 may also be implemented as separate pieces of hardware. Alternatively, the encoder 3 and the decoder 4 may be configured as a computer program operating on a central processing unit (CPU).

Meanwhile, for example, when the memory unit 2 receives a read request from outside, the controller reads the LDPC code from the memory medium and sends it to the decoder 4. Then, the decoder 4 decodes the LDPC code; restores the original input data 5; and outputs the restored input data 5 as output data 6 from the memory system 1.

When a flash memory is used as the memory medium, reading of information is done depending on whether the threshold voltage is high or low.

Given below is the explanation about LDPC codes. An LDPC code is characterized by a low-density matrix called a check matrix in which majority of the components are equal to 0 and only a small number of components are equal to 1. Depending on the code length, a large check matrix is required. However, for the sake of illustration, the following explanation is given about an 8×4 check matrix. An example of a check matrix H is given below in Equation (1).

$$H = \begin{bmatrix} 0 & 1 & 0 & 1 & 1 & 0 & 0 & 1 \\ 1 & 1 & 1 & 0 & 0 & 1 & 0 & 0 \\ 0 & 0 & 1 & 0 & 0 & 1 & 1 & 1 \\ 1 & 0 & 0 & 1 & 1 & 0 & 1 & 0 \end{bmatrix} \quad (1)$$

In the check matrix H, the count of 1 present in each row and each column is called weight, and the check matrix is created in such a way that the weights in all columns and all rows are greater than zero. When the column weight and the row weight are constant values, the check matrix is called a regular matrix. In the check matrix H given in Equation (1), all column weights are equal to four and all row weights are equal to two. Hence, the check matrix H is a regular matrix.

In the LDPC method, a data string x that is to be sent through a communication path or that is to be stored in a memory is converted into a data string c that satisfies $Hc^T=0$. This data string c is called a code. Thus, in the LDPC method, the data used in information processing is not the original data string x but is the code c obtained by conversion. The encoder 3 performs a conversion operation with respect to the data string containing the input data 5. The memory unit 2 writes the code c, which is obtained by conversion of the input data 5, in the flash memory.

Generally, the code c represents a data string having a greater data length than the data string x and contains, in addition to the information included in the data string x, information required in performing error correction. Meanwhile, encoding itself represents mapping with one-to-one correspondence. Thus, if the data string x is provided, the code c gets uniquely determined. Conversely, if the code c is provided, the original data string x gets uniquely determined. Moreover, (the length of the data string x)/(the length of the code c) is called a code rate. Herein, it can be said that, higher the code rate, the higher is the efficiency of the error correction.

Figure 2:
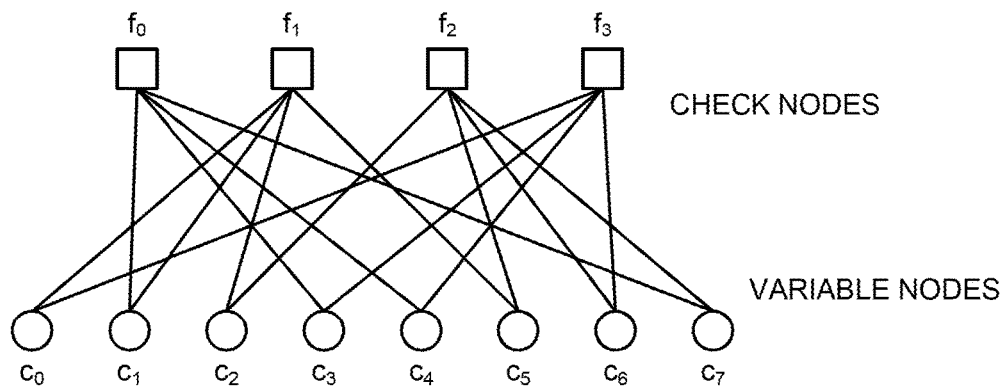
FIG. 2 is a schematic illustrating an exemplary Tanner graph of a check matrix.

The check matrix H can be expressed using a Tanner graph illustrated in FIG. 2. In the Tanner graph, nodes $\{c_0, c_1, \ldots c_7\}$ are arranged below nodes $\{f_0, f_1, f_2, f_3\}$. Then, regarding a component $h_{ij}$ of the check matrix H, only when the component $h_{ij}=1$ holds true, the nodes are connected by straight lines. In the Tanner graph, nodes $\{c_i\}$ are called variable nodes, and nodes $\{f_j\}$ are called check nodes. Each of the variable nodes $c_i$ corresponds to a row of the check matrix H; and the row numbers of the rows having the value "1" matches with the numbers assigned to the check nodes $f_j$ that are connected to the concerned variable node $c_i$. On the other hand, each of the check nodes $f_j$ corresponds to a column of the check matrix H; and the column numbers of the columns having the value "1" matches with the numbers assigned to the variable nodes $c_i$ that are connected to the concerned check node $f_j$.

Equation (2) presents an example of variable nodes $\{c_i\}$ and check nodes $\{f_j\}$ when the check matrix H provided in Equation (1) is used.

$$H \cdot c^T = \begin{bmatrix} c_1 + c_3 + c_4 + c_7 \\ c_0 + c_1 + c_2 + c_5 \\ c_2 + c_5 + c_6 + c_7 \\ c_0 + c_3 + c_4 + c_6 \end{bmatrix} = \begin{bmatrix} f_0 \\ f_1 \\ f_2 \\ f_3 \end{bmatrix} = 0 \quad (2)$$

A basic operation of LDPC code decoding will now be explained. It is assumed herein that the decoding operation explained below is performed by, for example, the decoder 4. In such a configuration, the decoder 4 reads a code stored in the memory unit 2, and decodes the code to recover the original data. Generally known as an error correction method used for LDPC codes is a method using belief propagation (BP). The BP will now be explained.

To begin with, for a string "$y$"=$\{y_i\}$ of some physical quantities, each of the variable nodes $c_i$ receives a probability $Q_{0i}$ at which the digital value corresponding to each of the values $y_i$ is "0". Each of the variable nodes $c_i$ then sends the probabilities $Q_{0i}$ to the check nodes $\{f_j, f_h, \ldots\}$ to which that variable node $c_i$ is connected, as messages $\{q_{ij}, q_{ih}, \ldots\}$ (see (a) in FIG. 3).

An example of the string "y" of physical quantities is a bit string read from the memory unit 2. When a flash memory is used as a memory medium, the memory unit 2 reads the threshold voltages of the time when the bit string is read from the memory medium, and converts the threshold voltages into probability values by calculating probabilities indicating likelihood for respective bits of the bit string. Each of the variable nodes $c_i$ then receives the probability values of the respective bits as probabilities $Q_{0i}$.

The check node $f_j$ then calculates, taking the parity condition into account, probabilities $\{r_{ji}, r_{jk}, \ldots\}$ at which the respective variable nodes $\{c_i, c_k \ldots\}$ is a digital data value of "1", based on messages $q=\{q_{ij}, q_{kj}, \ldots\}$ received from the respective variable nodes $\{c_i, c_k, \ldots\}$ connected to that check node $f_j$. The check node $f_j$ then sends back the probabilities $\{r_{ji}, r_{jk}, \ldots\}$ to the corresponding variable nodes $\{c_i, c_k, \ldots\}$ as messages $r_{ij}$ (see (b) in FIG. 3).

When a check node $f_j$ calculates a message $r_{ji}$ to be sent back to a variable node $c_i$, the check node $f_j$ does not include the message $q_{ij}$ received from that variable node $c_i$. In other words, the variable node $c_i$ receives the messages $r_{ji}$ corresponding to the variable nodes other than that corresponding to that variable node $c_i$. More particularly, the check node $f_j$ performs the check node processing following Equation (3) below to calculate the messages $r_{ji}$. In Equation (3), the value A(j) represents a set of subscripts {i, k, . . . } given to the variable nodes that are connected to that check node $f_j$.

$$r_{ij} = \frac{1}{2} + \frac{1}{2} \prod_{k \in A(j)-\{i\}} (1 - 2q_{kj}) \qquad (3)$$

A variable node $c_i$ performs variable node processing based on the messages (probabilities) $\{r_{ji}, r_{ki}, \ldots\}$ received from the respective check nodes $\{f_j, f_k, \ldots\}$ that are connected to that variable node $c_i$.

In other words, the variable node $c_i$ calculates a probability $Q'_i$ at which the received data is originally "0", using the messages $\{r_{ji}, r_{ki}, \ldots\}$ and the probability $Q_{0i}$ retained by that variable node $c_i$. As a result of calculation, if the probability $Q'_i$ is equal to or greater than ½, the variable node $c_i$ presumes that the value of the received data is "1". If the probability $Q'_i$ is smaller than ½, then the variable node $c_i$ presumes that the value of the received data is "0".

During the error correction according to the LDPC method, the parity check is performed using the presumed value. More particularly, with respect to a presumed-value string $c_{temp}=\{c_{0temp}, c_{1temp}, \ldots\}$, it is determined whether $Hc_{temp}^T=0$ holds true. If $Hc_{temp}^T=0$ holds true, calculations are ended under the estimation that the presumed-value string is a digital data string in which the presumed value $c_{temp}$ was stored. However, if $Hc_{temp}^T=0$ does not hold true, then the variable node $c_i$ recalculates the message $q=\{q_{ij}, q_{kj}, \ldots\}$ and sends the calculation result to the check nodes $\{f_j, f_k, \ldots\}$ (see (b) in FIG. 3).

The specific calculation performed by the variable node $c_i$ is as Equation (4) below.

$$q_{ij} = KQ_{01} \prod_{k \in B(i)-\{j\}} r_{ki} \qquad (4)$$

Where the value B(i) in Equation (4) represents a set of subscripts {j, k, . . . } given to the check nodes f connected to the variable node $c_i$, and the value K is a normalization constant determined to satisfy Equation (5) below.

$$K\left\{Q_{01} \prod_{k \in B(i)-\{j\}} r_{ki} + (1-Q_{01}) \prod_{k \in B(i)-\{j\}} (1-r_{ki})\right\} = 1 \qquad (5)$$

Herein, the message $q_{ij}$ that is sent from the variable node $c_i$ to the check node $f_j$ represents "the probability at which the value of digital data of the variable node $c_i$ is equal to 1" calculated based on probability Q01 and probability {rki, rli, . . . }. That message is not included in the message $r_{ji}$ received from the check node $f_j$. That is, as a result of receiving the message $q_{ij}$, the check node $f_j$ receives message on the check nodes except for itself.

Upon receiving the message q, the check node calculates the message (probability) r based on the received message q, and returns a variable node. This abovementioned algorithm is repeatedly implemented until the parity condition is satisfied. That is, the presumed-value string $c_{temp}$ is updated using the calculated message r; and, until $Hc_{temp}^T=0$ holds true with respect to the updated presumed-value string $c_{temp}$, the algorithm is repeatedly implemented.

In the embodiments, the process from when each of the variable nodes calculates and transmits the messages q to the corresponding check nodes, and to when the variable node receives the messages r from the corresponding check nodes is used as a unit of the error correction, and this unit is herein referred to as an "iteration".

Figure 4:
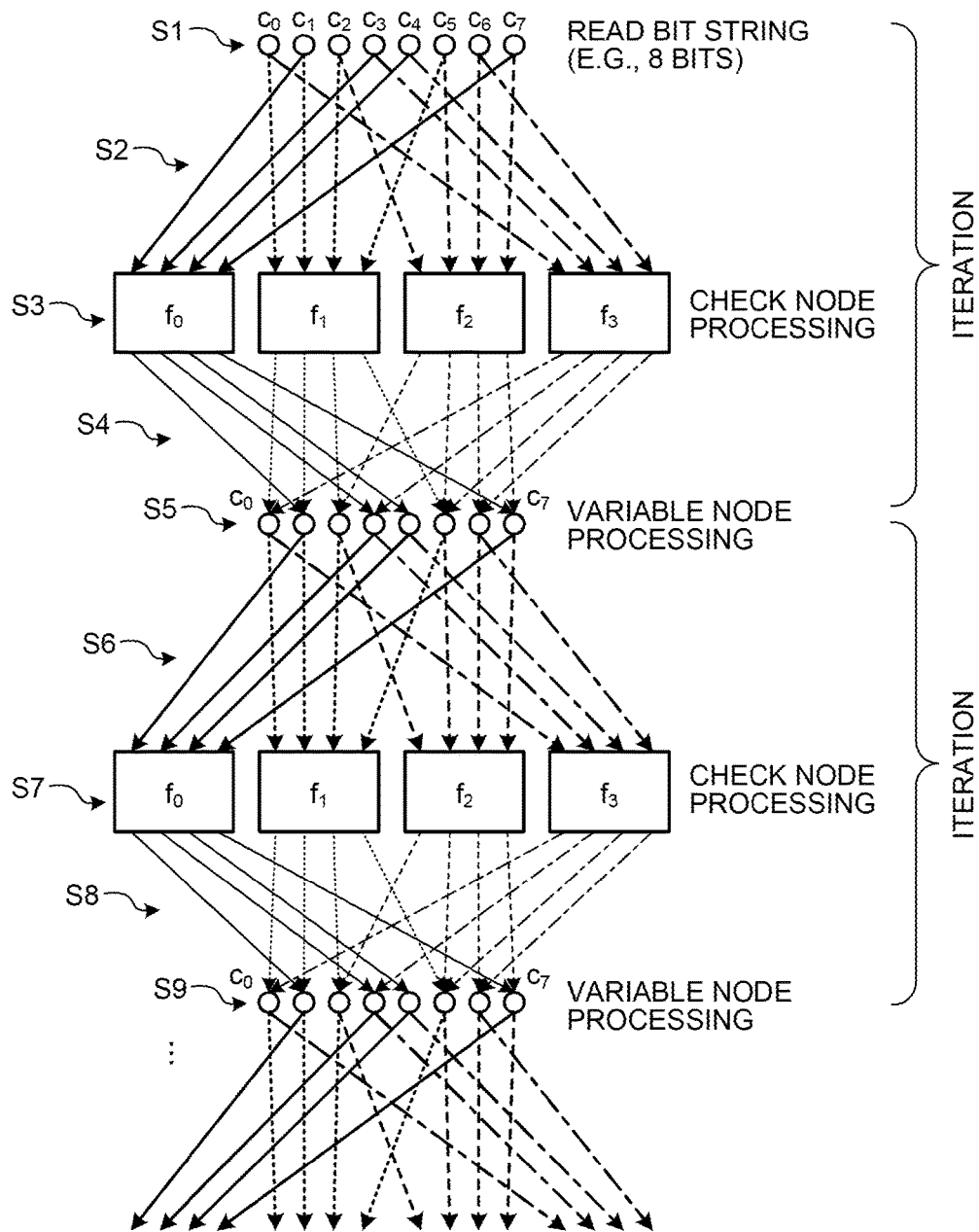
FIG. 4 is a schematic illustrating the steps of LDPC code decoding that uses belief propagation (BP)

FIG. 4 is a schematic representation of LDPC code decoding using the BP explained above. Illustrated in FIG. 4 is an example in which a matrix of four rows and eight columns presented as an example in Equation (1) is used as the check matrix H. In other words, in the example illustrated in FIG. 4, variable nodes $c_i$ include eight variable nodes $\{c_0, c_1, c_2, c_3, c_4, c_5, c_6, c_7\}$ and the check nodes $f_j$ includes four check nodes $\{f_0, f_1, f_2, f_3\}$.

At Step S1 in FIG. 4, the variable nodes $c_i$ receive the probabilities $Q_{0i}$ corresponding to respective eight bits read from the memory unit 2, for example. The variable nodes $c_i$ then updates the presumed value string $c_{temp}$ based on the received probabilities $Q_{0i}$, and sends the probabilities $Q_{0i}$ to the check nodes $f_j$ as the messages $q_{ij}$, based on the check matrix H (Step S2).

The check nodes $f_j$ then perform the check node processing, following Equation (3), based on the received messages $q_{ij}$ (Step S3), and send back the results to the corresponding variable nodes $c_i$, as the messages $r_{ji}$ based on the check matrix H (Step S4). The messages $r_{ji}$ are then received by the corresponding variable nodes $c_i$ (Step S5).

Each of the variable nodes $c_i$ then performs the variable node processing based on the received messages $r_{ji}$. The variable node $c_i$ recalculates the messages $q_{ij}$ if the variable node $c_i$ determines that $Hc^T=0$ is not established with the presumed value string $c_{temp}$, as a result of the variable node processing.

The variable node $c_i$ then transmits the recalculated messages $q_{ij}$ to the corresponding check nodes $f_j$ (Step S6). Each of the check nodes $f_j$ performs the check node processing based on the received messages $q_{ij}$ (Step S7), and transmits the resultant messages $r_{ji}$ to the corresponding variable nodes $c_i$ (Step S8). The messages $r_{ji}$ are then received by the variable nodes $c_i$ (Step S9). The variable nodes $c_i$ then update the presumed value string $c_{temp}$ based on the received messages $r_{ji}$.

The process from when the variable nodes $c_i$ calculates the messages $q_{ij}$ at Step S5 to when the check node $f_j$ receives the messages $r_{ji}$ at Step S9 is repeated, as a unit of repetitive process until the parity condition is satisfied. This unit of repetitive process corresponds to the iteration mentioned above.

The process from when the presumed value string $c_{temp}$ is updated based on the received probabilities $Q_{0i}$ and the probabilities $Q_{0i}$ are transmitted to the corresponding check nodes $f_j$ to when the messages $r_{ji}$ are received at Step S5 is also considered as equivalent to the unit of the repetitive process.

Details of Error Correction According to Embodiments

In the error correction using the BP, probabilities Q' for estimating the original data in the respective variable nodes are calculated by exchanging the probability values between the variable nodes and the check nodes. Information eventually required in this series of processes is information of whether the probability Q' is higher than ½, and details of the specific values are less important. Therefore, the probability calculations in the variable node processing and the check node processing do not need to be very exact. A message received from one of the check nodes, in particular, has a limited impact on the final result because the probabilities are calculated in the variable node processing by multiplying the messages received from the check nodes.

Therefore, while the messages transmitted from the check nodes to the variable nodes are updated once in every iteration, the final results are not affected very much even if one or more of the check nodes are kept unupdated.

In the embodiments, considering this point, one or more of the check nodes $\{f_0, f_1, \ldots\}$ are temporarily kept unupdated so that the check node processing is temporarily kept resting in each iteration. The check nodes to be temporarily kept unupdated are changed between successive iterations. In replacement of the message to be transmitted from the temporarily resting check nodes to the variable nodes, the message calculated by that check node and stored in a memory in the previous iteration is transmitted, for example.

In the manner described above, by keeping one or more of the check nodes $\{f_0, f_1, \ldots\}$ temporarily unupdated in each iteration, resources required for the check node processing can be reduced. Furthermore, the check node processing can be executed at a higher speed depending on the configuration required for the check node processing.

Figure 5:
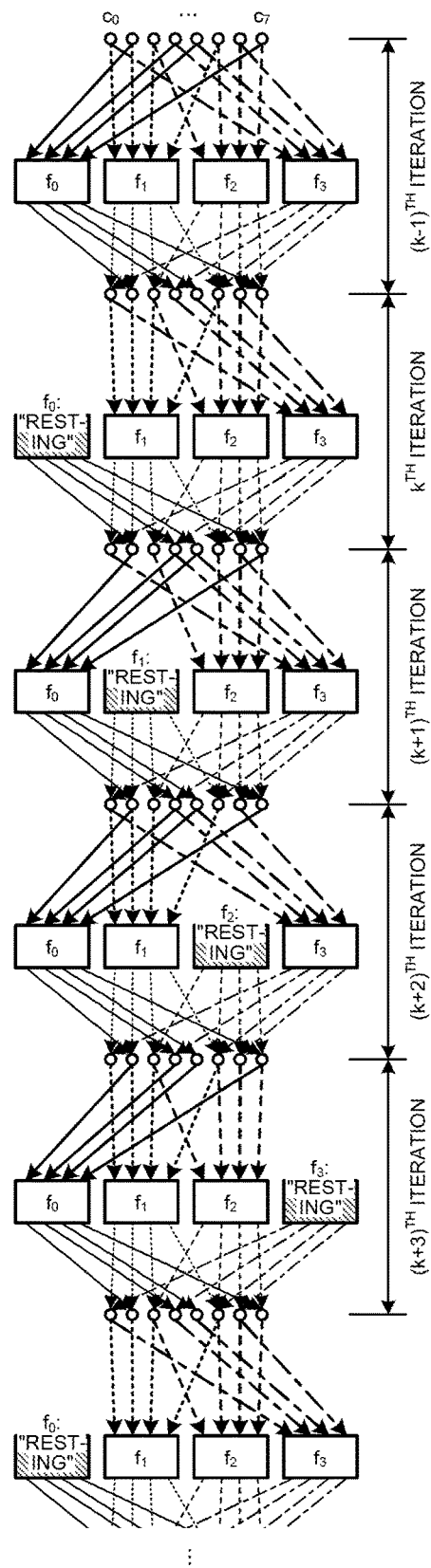
FIG. 5 is a schematic illustrating the steps of the LDPC code decoding that uses BP according to the embodiments.

FIG. 5 is a schematic representation of the steps in the LDPC code decoding using the BP according to the embodiments. In the example illustrated in FIG. 5, the matrix of four rows and eight columns, which is presented as an example in Equation (1), is used as the check matrix H, and the variable nodes $c_j$ includes the eight variable nodes $\{c_0, c_1, c_2, c_3, c_4, c_5, c_6, c_7\}$, and the check nodes $f_j$ include four check node $\{f_0, f_1, f_2, f_3\}$, in the same manner as in the example illustrated in FIG. 4. In FIG. 5, the check nodes $f_j$ temporarily kept unupdated are shown as hatched, and are indicated as "resting".

The variable nodes and the check nodes are implemented using memory medium such as memories or registers.

In the $k^{th}$ iteration, the check node $f_0$ is kept unupdated. In other words, in the $k^{th}$ iteration, the check node $f_0$ does not receive the messages $q_{ij}$ from the variable nodes $c_i$, and does not update the values that are the probabilities $r_{0i}$. As the message $r_{0i}$ sent back from the check node $f_0$ to the variable nodes $c_i$, the message $r_{0i}$ resulting from the $(k-1)^{th}$ iteration and stored separately is used instead.

In the $k^{th}$ iteration, the other check nodes $f_1$ to $f_3$ update their values as usual, and sends back their messages to the variable nodes $c_i$. The message $r_{1i}$ from the check node $f_1$ in which the value is not updated in the subsequent $(k+1)^{th}$ iteration is stored separately in the memory.

In the same manner, the check nodes $f_1$, $f_2$, and $f_3$ are kept temporarily unupdated in the $(k+1)^{th}$, the $(k+2)^{th}$, and the $(k+3)^{th}$ iterations, respectively. Therefore in the $(k+1)^{th}$, the $(k+2)^{th}$, and the $(k+3)^{th}$ iterations, the check nodes $f_1$, $f_2$, and $f_3$ neither receive the messages $q_{ij}$ from the variable nodes $c_i$, nor their values are updated. The check nodes $f_1$, $f_2$, and $f_3$ use the values stored in the previous iterations as the messages sent back to the variable nodes $c_i$, and the message from the check node that is to be kept temporarily unupdated in the subsequent iteration is also stored in the memory.

In the manner described above, by keeping one or more of the check nodes $f_0$ to $f_3$ temporarily unupdated in each iteration, the check node processing can be executed in a smaller number of check nodes, being smaller than the number of check nodes defined by the check matrix H. In this manner, the amount of computations (the degree of concurrency) required in check node processing can be reduced, so that the circuit can be downscaled.

In the example in FIG. 5, the $(k-1)^{th}$ iteration is the first iteration in the repetitive process of iterations. The process in the first iteration is substantially the same as the process from Step S1 to Step S5 in FIG. 4. In other words, in the $(k-1)^{th}$ iteration, the variable nodes $c_i$ receive probabilities $Q_{0i}$ corresponding to the respective bits read from the memory unit 2, for example, update the presumed value string $c_{temp}$, and transmit the messages $q_{ij}$ to the check nodes $f_0$ to $f_3$.

At this time, if the messages $q_{ij}$ are transmitted to all of the check nodes $f_0$ to $f_3$, to cause the check nodes $f_0$ to $f_3$ to perform the check node processing, the reduction effect of check node processing might not be achieved sufficiently.

To address this issue, therefore, in the first iteration, the messages $q_{ij}$ are not transmitted to a check node (for example, the check node $f_3$) that is not to be kept temporarily unupdated in the subsequent iteration (the $k^{th}$ iteration in the example illustrated in FIG. 5), so that the check node is temporarily kept unupdated. As the messages $r_{ij}$ to be transmitted from this check node to the variable nodes $c_i$, a fixed value stored in the memory in advance, for example, is used. An example of the fixed value is ½. The fixed value may be any value that can be used as a probability value, without limitation to ½.

Figure 6:
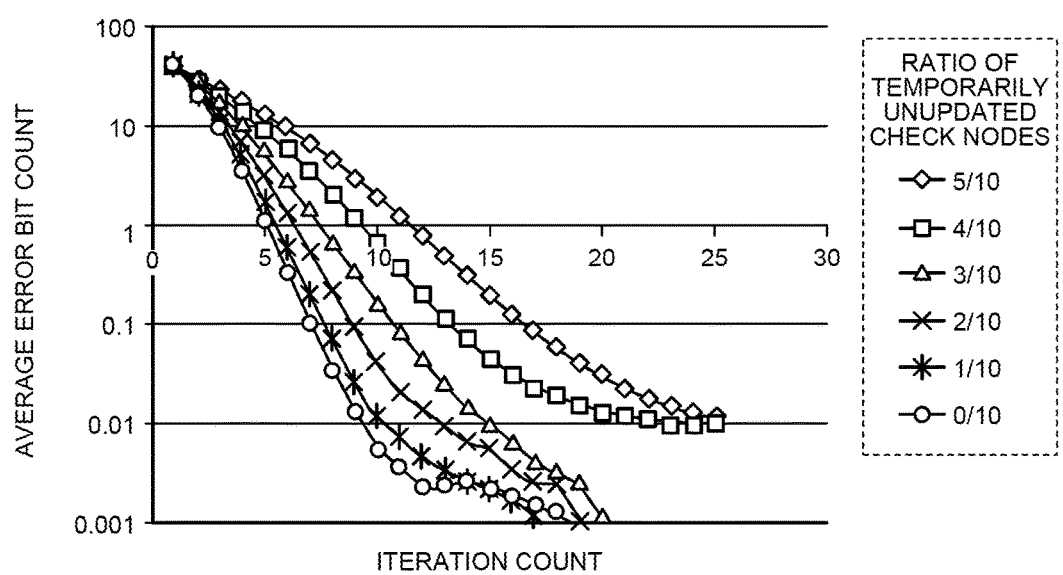
FIG. 6 is a schematic for explaining the advantageous effects achieved by keeping one or more check nodes unupdated in the embodiments.

Explained now with reference to FIG. 6 is some advantageous effects achieved by keeping one or more of the check nodes temporarily unupdated in the embodiments. FIG. 6 illustrates examples of error bit counts achieved by changing the ratio of the check nodes temporarily kept unupdated in every iteration, except the first iteration, in the LDPC code error correction. In the example illustrated in FIG. 6, the error correction is applied to an LDPC code with a code length of 1 kilobit. The check node temporarily kept unupdated transmits the value stored from the previous iteration.

In FIG. 6, the circles represent the results when the ratio of the check nodes temporarily kept unupdated is zero, the asterisks, the crosses, the triangles, and the rhomboids represent the results when the ratio of the check nodes temporarily kept unupdated are 1/10, 2/10, 3/10, 4/10, and 5/10, respectively. In FIG. 6, the vertical axis represents the average error bit count resulting from error corrections, and the horizontal axis represents the iteration count.

When the check nodes temporarily kept unupdated occupies a ratio of equal to or lower than 3/10, the average error bit count declines as the iteration is repeated. By contrast, when the check nodes temporarily kept unupdated occupies a ratio of equal to or higher than 4/10, the average error bit count does not decline as the iteration is repeated, and the error floor appears.

It is preferable to change the check node temporarily kept unupdated in each of the iterations. It is also preferable to keep each of the check nodes temporarily unupdated at a fair ratio. If each of the check nodes is kept temporarily unupdated at an unfair ratio, some of the variable nodes may fall incapable of correcting errors appropriately.

Used in the error correction illustrated in FIG. 6 is a check matrix in which every variable node is connected to three check nodes. As explained with reference to FIG. 3 and Equation (3), when a variable node transmits messages to a check node, the variable node transmits messages resultant of the messages sent back from the check nodes except for that check node. Therefore, in the example illustrated in FIG. 6, the messages to be transmitted to a check node are derived from the information from the other two check nodes.

When the number of check nodes kept temporarily unupdated occupies one third of the entire check nodes, one of the two check node remain temporarily unupdated. When the number of check nodes kept temporarily unupdated occupies more than one third of the entire check nodes, both of these two check nodes may stay temporarily unupdated. In such a case, because the messages returned from the variable nodes to the check nodes remain unupdated as well, the error correction cannot be performed appropriately. This is the reason why the error floor appears when the ratio of the check nodes temporarily kept resting is 4/10 or 5/10 in FIG. 6.

Let us now discuss the ratio of check nodes that are kept temporarily unupdated with respect to the entire check nodes in each iteration. It is assumed therein that average number of check nodes connected to each of the variable nodes is N (where N>2). As described earlier, when the ratio between the check nodes temporarily kept unupdated and the entire check nodes with respect to a variable node exceeds (N−2)/N, the messages to be returned from the variable node to the check nodes may not be updated, so that the error correction may not be performed appropriately. Therefore, it is preferable for the ratio between the check nodes kept temporarily unupdated and the entire check nodes with respect to a variable node to be equal to or lower than (N−2)/N.

First Embodiment

Figure 7:
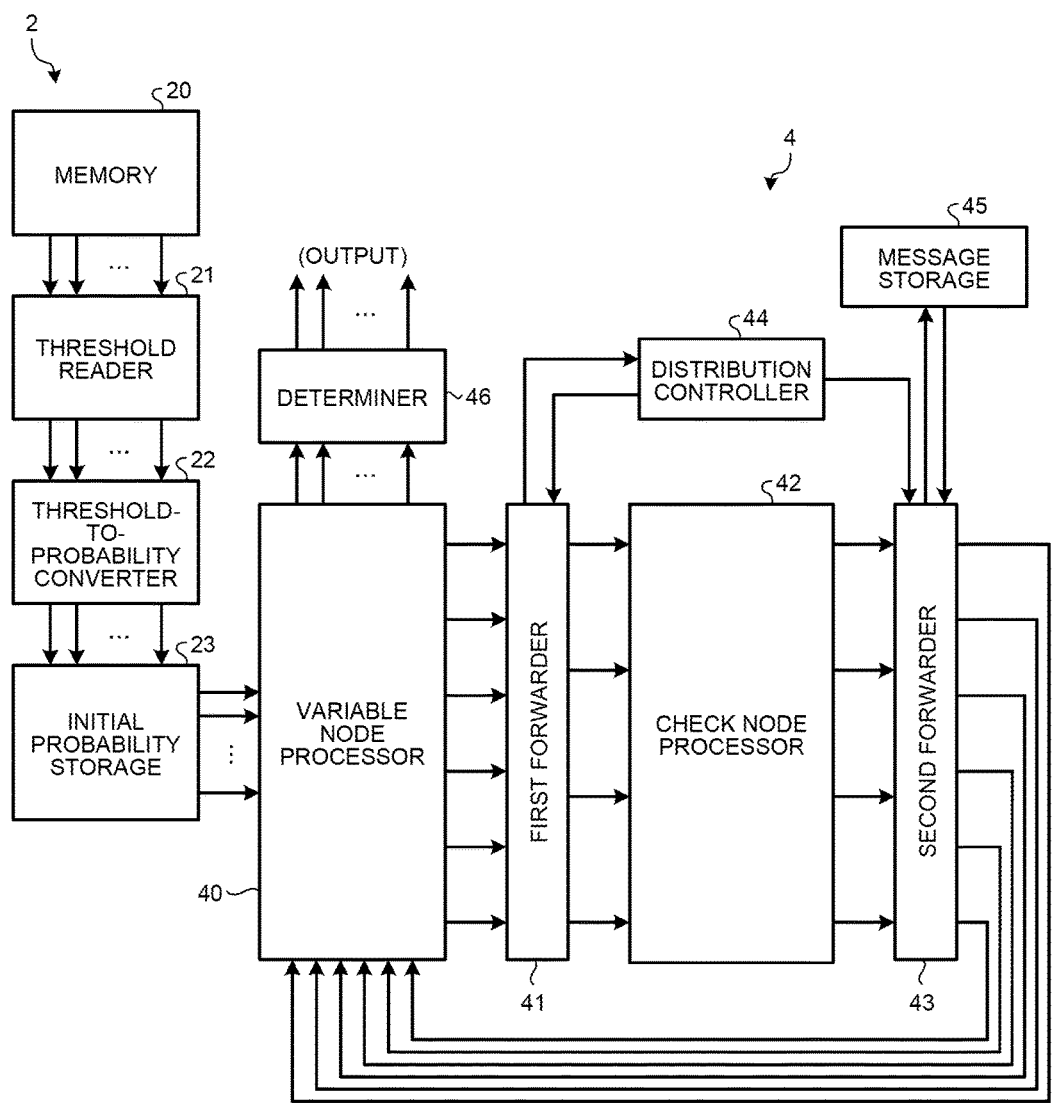
FIG. 7 is a block diagram illustrating a configuration of an exemplary decoding device according to a first embodiment.

FIG. 7 illustrates an exemplary configuration of a decoding device according to the first embodiment. In FIG. 7, the decoder 4 includes a variable node processor 40, a first forwarder 41, a check node processor 42, a second forwarder 43, a distribution controller 44, and a message storage 45. The memory unit 2 includes a memory 20, a threshold reader 21, a threshold-to-probability converter 22, and an initial probability storage 23.

The decoder 4 is implemented as hardware, and the units included in the decoder 4 are integrated into one semiconductor chip, for example, but without limitation. The units included in the decoder 4 may be partly or entirely implemented as separate respective pieces of hardware. The message storage 45 includes a rewritable non-volatile memory and a structure for reading and writing data from and to the non-volatile memory, for example. The units included in the memory unit 2 are also integrated into one semiconductor chip, for example. The units included in the memory unit 2 may be partly or entirely implemented as separate respective pieces of hardware.

The decoder 4 and the memory unit 2 operate under the control of a higher-level structure above the memory system 1 in which the decoder 4 and the memory unit 2 are included, for example, but without limitation. Alternatively, the memory system 1 may be provided with a controller, and the controller may control the operations of the decoder 4 and the memory unit 2. In the explanation hereunder, it is assumed that the number of check nodes determined by the check matrix H is six, for the purpose of explanation.

In the memory unit 2, the memory 20 is a memory medium, and an example of the memory 20 is a flash memory. The threshold reader 21 reads the threshold voltage when a bit string is read from the memory 20. The threshold-to-probability converter 22 converts the threshold voltage into a probability value by calculating a probability indicating likelihood for each bit of the bit string, based on the threshold voltage acquired by the threshold reader 21. The probability values of the respective bits acquired by the threshold-to-probability converter 22 are stored in the initial probability storage 23.

In the decoder 4, the variable node processor 40 performs the variable node processing and calculates the probabilities $Q_{0i}$ based on the probability values stored in the initial probability storage 23 or the messages (probability values) $r_{ji}$ received from the second forwarder 43 described later. The variable node processor 40 transmits the calculated probabilities $Q_{0i}$ to the first forwarder 41 as the messages $q_{ij}$.

Upon receiving the messages $q_{ij}$ from the variable node processor 40, the first forwarder 41 notifies the distribution controller 44 of the reception. The first forwarder 41 also selects the messages to be applied with the check node processing by the check node processor 42 from the messages $q_{ij}$, and forwards the selected messages to the check node processor 42, under the control of the distribution controller 44.

The check node processor 42 performs the check node processing to the check nodes in a number less than a predefined number of check nodes, being predefined by the check matrix H, and calculates the probabilities $r_{ij}$. For example, the check node processor 42 performs the check node processing to four out of the six check nodes, the six being the number of check nodes defined by the check matrix H. The check node processor 42 then updates the check nodes with respective probabilities $r_{ji}$ calculated in the check node processing, and transmits the probabilities $r_{ji}$ to the second forwarder 43 as the messages $r_{ji}$.

The second forwarder 43 stores designated one or more messages from the messages $r_{ji}$ received from the check node processor 42 in the message storage 45, under the control of the distribution controller 44. In this example, because the check node processing is performed to the four check nodes out of six, which is the number predefined by the check matrix H, the second forwarder 43 stores the messages corresponding to at least two check nodes, representing the difference between four and six, in the message storage 45.

The second forwarder 43 transmits the messages $r_{ji}$ received from the check node processor 42 and the messages resulting from the previous iteration and stored in the message storage 45 to the variable node processor 40 so that such messages are supplied to the appropriate variable nodes, under the control of the distribution controller 44. The variable node processor 40 calculates the probabilities $Q_{0i}'$ for the respective variable nodes, and acquires a presumed value string $c_{temp}$.

A determiner 46 determines whether $Hc_{temp}=0$ is established with the presumed value string $c_{temp}$ acquired by the variable node processor 40. If the determiner 46 determines that $Hc_{temp}=0$ is established, the determiner 46 converts the probabilities $Q_{0i}$, which are calculated for the respective variable nodes, into respective bits values, and outputs the bit values to a higher-level structure above the memory system 1, for example. If the determiner 46 determines that $Hc_{temp}=0$ is not established, the determiner 46 notifies the higher-level structure of $Hc_{temp}=0$ not being established.

A process of the $k^{th}$ iteration performed in the distribution controller 44 will now be explained more in detail. Upon being notified that the messages $q_{ij}$ are received from the first forwarder 41, the distribution controller 44 determines the check nodes to which the received message $q_{ij}$ are to be forwarded, and forwards the messages $q_{ij}$ to the determined check nodes in the check node processor 42.

At this time, the distribution controller 44 controls the first forwarder 41 so as not to forward messages $q_{i,A}$ to be addressed to a check node $f_A$ belonging to a subset A, including one or more of the check nodes $f_j$, to the check node processor 42. In other words, the distribution controller 44 forwards the messages resulting from excluding the message $q_{iA}$ to be sent to the check node $f_A$, included in the subset A, from the messages $q_{ij}$ to be sent to the entire check nodes $f_j$ (referred to as messages $q_{i(j-A)}$) to the check node processor 42. In this manner, the check node processing for the check node $f_A$ is temporarily kept resting, and the check node $f_A$ is left unupdated.

Under such control, the first forwarder 41 forwards the message $q_{i(j-A)}$ to the check node processor 42.

The check node processor 42 performs the check node processing corresponding to the respective check nodes. Because the first forwarder 41 does not forward the message $q_{iA}$ to be sent to a check node $f_A$ belonging to the subset A to the check node processor 42, the check node processor 42 does not perform the process corresponding to the check node $f_A$ belonging to the subset A. The check node processor 42 transmits messages $r_{(j-A)i}$ generated in the check node processing to the second forwarder 43. These messages $r_{(j-A)i}$ are messages generated by applying check node processing to the remaining check nodes after excluding the check node $f_A$ from the entire check nodes $f_j$.

The distribution controller 44 then controls the second forwarder 43 to read a message $r_{Ai}'$ from the message storage 45. The message $r_{Ai}'$ is a message resulting from the subset A and is stored in the previous iteration (in this example, in the $(k-1)^{th}$ iteration). The messages $r_{Ai}'$ read from the message storage 45 are used as replacement of the messages $r_{Ai}$ excluded by the check node processor 42 and left out without being forwarded in the $k^{th}$ iteration.

Before executing the process of the iteration for the first time (first iteration), messages serving as initial values are stored in the message storage 45. These messages serving as the initial values may be any value that can be used as probability values, without limitation. For example, ½ may be stored as an initial value in the message storage 45.

The distribution controller 44 controls to cause the second forwarder 43 to forward the messages $r_{Ai}'$ read from the message storage 45, and the messages $r_{(j-A)i}$ received from the check node processor 42 to the variable node processor 40. At this time, the distribution controller 44 determines the variable nodes to which these messages $r_{Ai}'$ and messages $r_{(j-a)i}$ are to be transmitted, and controls the second forwarder 43 to forward the messages to the determined variable nodes in the variable node processor 40.

The distribution controller 44 also controls to cause the second forwarder 43 to store the messages (referred to as messages $r_{Bi}$) received from a check node $f_B$ belonging to a subset B in the message storage 45. The check node $f_B$ is a check node for which the check node processing is to be temporarily kept resting in the subsequent $(k+1)^{th}$ iteration, among the entire check nodes $f_j$.

As an example, the distribution controller 44 may select the check node for which the check node processing is to be temporarily kept resting in the $k^{th}$ iteration, the $(k+1)^{th}$ iteration, . . . , and so on, sequentially from the check nodes $f_0$ to $f_3$, e.g., the check node $f_0$, the check node $f_1$, . . . , as illustrated in FIG. 5 explained above, but without limitation. Alternatively, the distribution controller 44 may randomly select the check node for which the check node processing is to be temporarily kept resting from the check nodes $f_0$ to $f_3$, using a random number, for example. The distribution controller 44 may also select the check node for which the check node processing is to be temporarily kept resting based on a table prepared in advance.

Under such control, the second forwarder 43 forwards the messages $r_{Ai}'$ and messages $r_{(j-A)i}$ to the variable nodes determined by the variable node processor 40, and stores the messages $r_{Bi}$ in the message storage 45.

Using the messages $r_{Ai}'$ and messages $r_{(j-A)i}$ received from the second forwarder 43, the variable node processor 40 calculates probabilities $Q_{0i}'$ at which the bits in the respective variable nodes are 0 (or 1). The variable node processor 40 then transmits the calculated probabilities $Q_{0i}'$ to the determiner 46. The process up to when the variable node processor 40 transmits the probabilities $Q_{0i}'$ to the determiner 46 is the process within the scope of the $k^{th}$ iteration.

The determiner 46 then determines whether the calculations have been converged, based on the probabilities $Q_{0i}'$. In other words, the determiner 46 determines, for the presumed value string $c_{temp}$, whether the values in $Hc_{temp}{}^T$ have converged, based on the probabilities $Q_{0i}'$. If the determiner 46 determines that the calculations have been converged, the determiner 46 outputs the probabilities $Q_{0i}'$, or bit values resultant of converting the probabilities $Q_{0i}'$ to the higher-level structure.

If the determiner 46 determines that the calculations have not been converged yet, the determiner 46 transmits the notification to the higher-level structure, for example. In this case, the process of the following $(k+1)^{th}$ iteration is started under the control of the higher-level structure.

In the $(k+1)^{th}$ iteration, when the first forwarder 41 receives the message $q_{ij}$ from the variable node processor 40, the distribution controller 44 determines the check nodes to which the received messages $q_{ij}$ are to be forwarded. The distribution controller 44 then controls to cause the first forwarder 41 to forward the messages (referred to as messages $q_{i(j-b)}$) excluding the messages $q_{iB}$ that are to be forwarded to the check node $f_B$ to the appropriate check nodes in the check node processor 42. The check node $f_B$ belongs to the subset B that includes some of the entire check nodes $f_j$, and is different from the subset A.

As described above, the decoder 4 according to the first embodiment excludes the message to be transmitted to one or more of the check nodes from the messages $q_{ij}$ to be forwarded from the variable node processor 40 to the check node processor 42, and sends the remaining messages to the check node processor 42. The decoder 4 allows the variable node processor 40 to use a past message stored in the message storage 45, in replacement of the excluded message. In this manner, with the decoder 4 according to the first embodiment, the amount of computations required in the check node processing can be reduced, and the circuit of the check node processor 42 can be downscaled compared with existing structures.

In the configuration described above, it is preferable to change the subset of the check nodes excluded from those to which the first forwarder 41 forwards the messages, in every iteration. Preferably, a subset of check nodes excluded from those to which the first forwarder 41 forwards the message does not share any common check nodes with other subsets in successive iterations.

Figure 8:
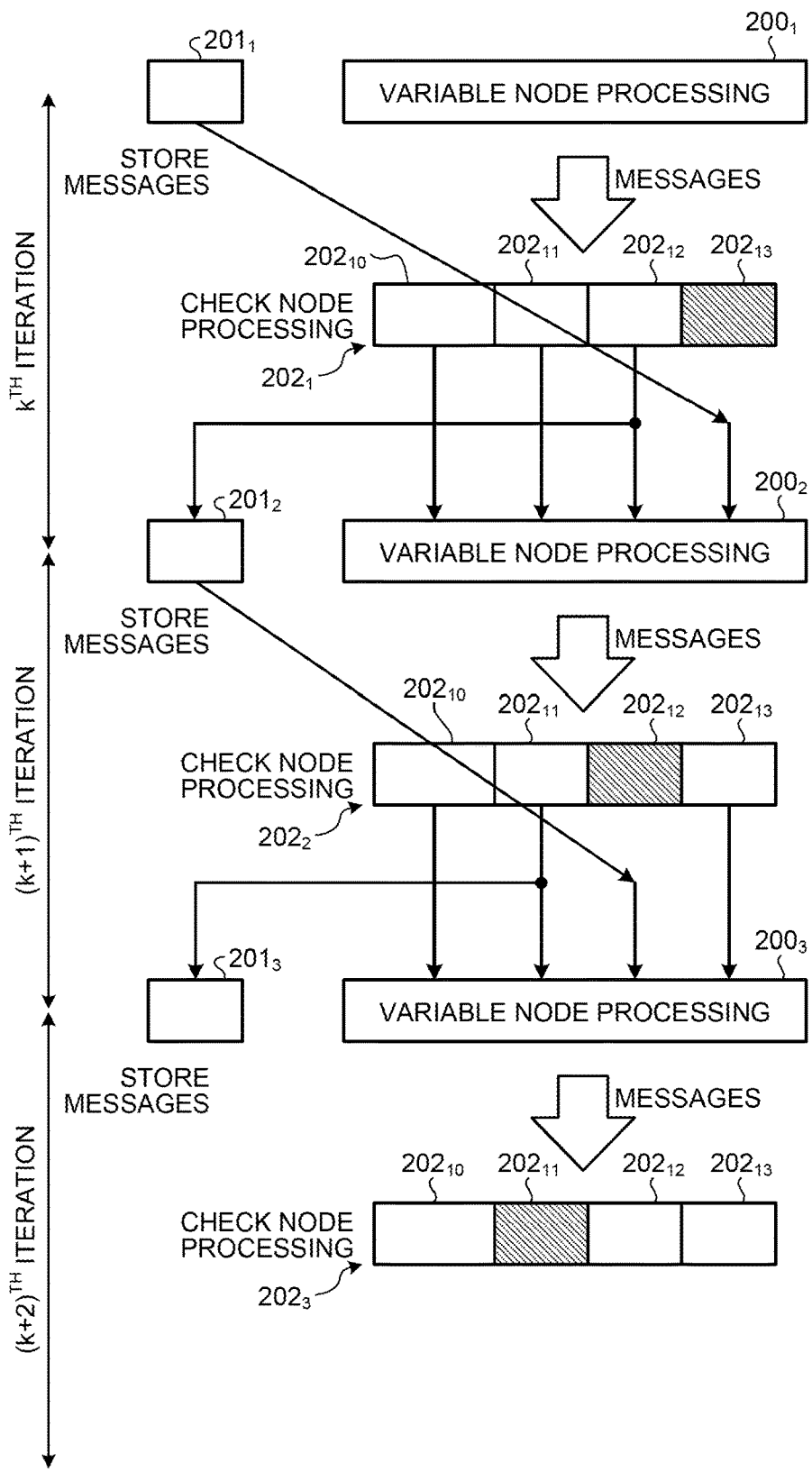
FIG. 8 is a schematic representing an example in which a subset of check nodes excluded from those to which messages are forwarded varies for each iteration in the first embodiment.
Figure 9:
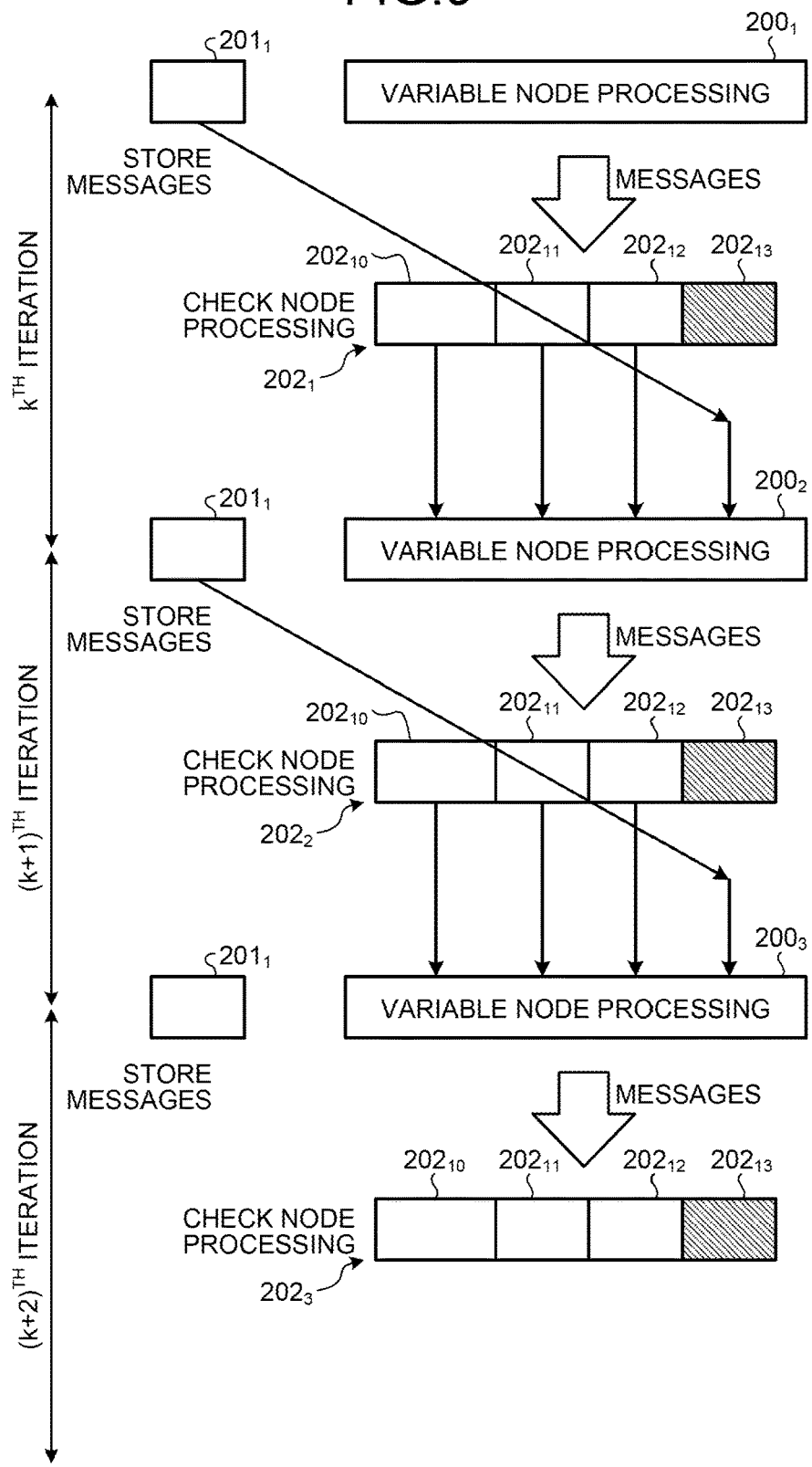
FIG. 9 is a schematic illustrating an example in which a subset of check nodes excluded from forwarding of messages remain unchanged in the entire iterations.

This exclusion will now be explained more specifically with reference to FIGS. 8 and 9. In FIGS. 8 and 9, the check nodes are grouped into four subsets $202_{10}$, $202_{11}$, $202_{12}$, and $202_{13}$ that include no common check nodes. In FIGS. 8 and 9, the subset of the check nodes for which the processing is temporarily kept resting is illustrated as hatched.

FIG. 8 is a schematic illustrating the decoding process according to the first embodiment. In the first embodiment, the check node processing is temporarily kept resting for a different check node in every iteration, as mentioned earlier.

In the example illustrated in FIG. 8, in check node processing $202_1$ in the $k^{th}$ iteration, the check node processing in a subset $202_{13}$ is temporarily kept resting, so that the check nodes in the subset $202_{13}$ remain unupdated, but the check node processing is executed to the remaining subsets $202_{10}$ to $202_{12}$, so that these check nodes are updated. The messages resulting from the check node processing performed to the subsets $202_{10}$ to $202_{12}$ including the updated check nodes are then forwarded to variable node processing $200_2$ for the following $(k+1)^{th}$ iteration.

In replacement of the messages for the subset $202_{13}$ in the $k^{th}$ iteration, the subset $202_{13}$ being a subset without its check nodes updated in the $k^{th}$ iteration, a message $201_1$ generated and stored as a result of the check node processing executed to the subset $202_{13}$ in the previous $(k-1)^{th}$ iteration is forwarded to the variable node processing $200_2$.

The message $201_2$ generated as a result of the check node processing performed to the subset $202_{13}$ is also stored in the $k^{th}$ iteration, for the subset $202_{13}$ that will not be updated in the following $(k+1)^{th}$ iteration.

In the $(k+1)^{th}$ iteration, the variable node processing $200_2$ is executed using the messages from the subsets $202_{10}$ to $202_{12}$ generated as a result of the check node processing $202_1$, and using the stored message $201_1$. The messages generated as a result of the variable node processing $200_2$ are then forwarded to check node processing $202_2$.

In the check node processing $202_2$, the check node processing of the subset $202_{12}$ is temporarily kept resting, so that the check nodes included in the subset $202_{12}$ remain unupdated. The subset $202_{12}$ is different from the subset $202_{13}$ for which the check node processing is temporarily kept resting in the $k^{th}$ iteration. In the remaining subsets $202_{10}$, $202_{11}$, and $202_{13}$, the check node processing is executed and the check nodes are updated. The messages generated as a result of performing the check node processing to the subset $202_{10}$, $202_{11}$, and $202_{13}$ including the updated check nodes are forwarded to variable node processing $200_3$ for the subsequent $(k+2)^{th}$ iteration.

In replacement of the message from the subset $202_{12}$ including the check nodes that are not updated in the $(k+1)^{th}$ iteration, the message $201_2$ generated and stored as a result of the check node processing in the previous $k^{th}$ iteration is forwarded to the variable node processing $200_3$, as a message corresponding to the subset $202_{12}$ in the $k^{th}$ iteration. A message $201_3$ generated as a result of performing the check node processing to the subset $202_{11}$ is stored in the $(k+1)^{th}$ iteration, because the subset $202_{11}$ will not be updated in the following $(k+2)^{th}$ iteration.

In the manner described above, in the decoding process according to the first embodiment, when the messages are forwarded from variable node processing $200_x$ (where the subscript x is 1, 2, . . . ) to the check node processing $202_x$, the messages are not forwarded to one or more of the check nodes. Therefore, those check nodes remain unupdated, and the messages stored in the previous iteration are forwarded to the variable node processing $200_x$ as a replacement.

FIG. 9 illustrates an example in which the check node processing for the same check nodes is temporarily kept resting during the entire iterations. In FIG. 9, parts that are the same as those in FIG. 8 are assigned with the same reference numerals, and detailed explanations thereof are omitted.

In the example illustrated in FIG. 9, the same check node processing of the subset $202_{13}$ is temporarily kept resting across the entire check node processing $202_1$, $202_2$, and $202_3$ in the respective iterations. In this case, for example, the subset $202_{13}$ cannot generate the message $201_2$, which is stored as a replacement for the $(k+1)^{th}$ iteration (see FIG. 8), in the $k^{th}$ iteration. Therefore, the variable node processing $200_2$ in the $(k+1)^{th}$ iteration keeps using the message $201_1$ that is the same as the message used in the $k^{th}$ iteration. In such a configuration, the calculation does not converge readily, so that error floor may occur.

Therefore, it is preferable for a set $C_k$ of the check node unupdated in the $k^{th}$ iteration to be different from the set $C_{k+1}$ of the check node unupdated in the $(k+1)^{th}$ iteration. If the set $C_k$ and the set $C_{k+1}$ share some check nodes, such common check nodes are updated less frequently, so that the calculation may not readily converge. Therefore, it is preferable that the set $C_k$ and the set $C_{k+1}$ do not share any check nodes.

Furthermore, to prevent the check nodes from being updated unfairly, it is preferable for the message from every check node to be replaced with a message stored in the past iteration at an equal frequency. For example, the check nodes for which the check node processing is temporarily kept resting may be distributed among the iterations so that the message from every check node is replaced at an equal frequency when an increase in the number of iterations reaches its limit. The check node for which the check node processing is to be temporarily kept resting may be selected sequentially in the respective successive iterations, or selected randomly using a random number, for example. The check node for which the check node processing is to be temporarily kept resting may also be selected based on a table prepared in advance.

Second Embodiment

A second embodiment will now be explained. The second embodiment describes an example in which a plurality of check node calculators, each of which performs the check node processing presented in Equation (3), are provided in parallel to the check node processor 42 according to the first embodiment explained with reference to FIG. 7.

Figure 10:
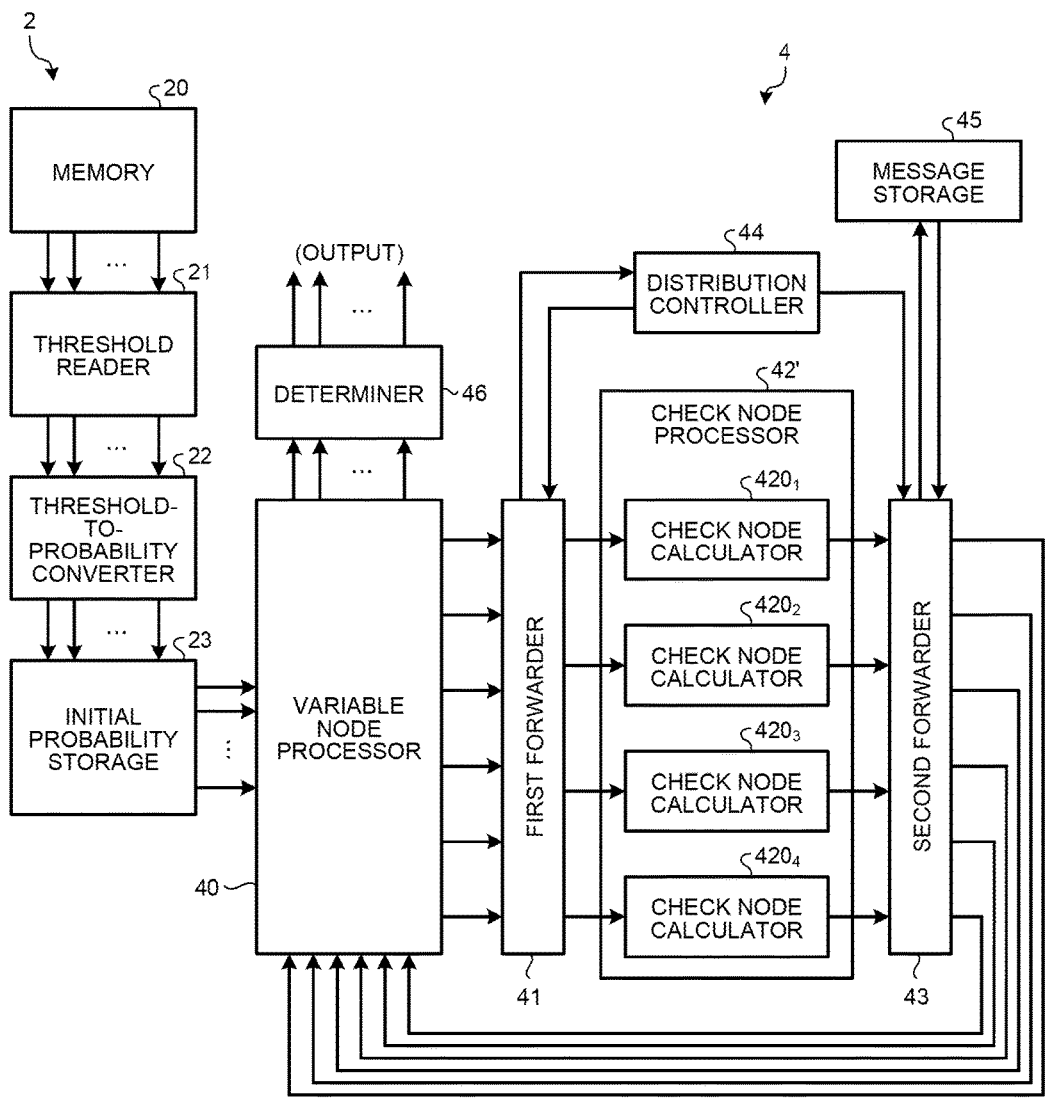
FIG. 10 is a block diagram illustrating an exemplary decoding device according to a second embodiment.

FIG. 10 illustrates an exemplary configuration of a decoding device according to the second embodiment. In FIG. 10, parts that are the same as those in FIG. 7 are assigned with the same reference numerals, and detailed explanations thereof are omitted. In the explanation hereunder, it is assumed that the number of check nodes defined by the check matrix H is six, for the purpose of explanation.

In the example illustrated in FIG. 10, a check node processor 42' includes four check node calculators $420_1$, $420_2$, $420_3$, and $420_4$, which is in a number less than the number of check nodes defined by the check matrix H. One third of the entire check nodes, therefore, will be kept temporarily unupdated in each of the iterations. Each of the check node calculators $420_1$, $420_2$, $420_3$, and $420_4$ performs the check node processing once or a plurality of number of times in every iteration.

When reception of the messages $q_{ij}$ is notified from the first forwarder 41, the distribution controller 44 determines the check nodes to which the received messages $q_{ij}$ are to be forwarded. The distribution controller 44 then controls to cause the first forwarder 41 to forward the messages $q_{ij}$ to the corresponding check node calculators $420_1$, $420_2$, $420_3$, and $420_4$ based on the result of check node determination. At this time, among the messages $q_{ij}$, the distribution controller 44 controls to cause the first forwarder 41 not to forward messages $q_{i2}$ that are to be forwarded to the two remaining check nodes to the check node processor 42'.

Under such control, the first forwarder 41 forwards the messages $q_{i(j-2)}$, which are resultant of excluding the messages $q_{i2}$ from the messages $q_{ij}$, to the check node processor 42'. The message $q_{i(j-2)}$ are then forwarded to the corresponding check node calculators $420_1$, $420_2$, $420_3$, and $420_4$.

The check node calculators $420_1$, $420_2$, $420_3$, and $420_4$ in the check node processor 42' perform their check node processing based on the received messages $q_{i(j-2)}$. The check node processor 42' then forwards the messages $r_{(j-2)i}$ calculated by the check node calculators $420_1$, $420_2$, $420_3$, and $420_4$ to the second forwarder 43.

The distribution controller 44 controls to cause the second forwarder 43 to read messages $r_{ji}'$, acquired from the two check node and stored in the previous iteration, from the message storage 45. The messages $r_{ji}'$ read from the message storage 45 are used as replacement for the messages excluded by the check node processor 42 as not to be forwarded in the this iteration.

The distribution controller 44 controls to cause the second forwarder 43 to forward the messages $r_{ji}'$ read from the message storage 45 and the messages $r_{(j-2)i}$ received from the check node processor 42 to the variable node processor 40. At this time, the distribution controller 44 determines the variable nodes to which these message $r_{Ai}'$ and the messages $r_{(j-A)i}$ are to be forwarded, and controls to cause the second forwarder 43 to forward the messages to the determined variable nodes in the variable node processor 40.

The distribution controller 44 also controls to cause the second forwarder 43 to store the message received from the two out of the entire check nodes $f_j$ in the message storage 45. These two being the check nodes for which the check node processing is temporarily kept resting in the subsequent iteration.

Under such control, the second forwarder 43 forwards the message $r_{ji}'$ and the messages $r_{(j-2)i}$ to the determined variable nodes in the variable node processor 40, and stores the message received from the two check nodes for which the check node processing is to be temporarily kept resting in the subsequent iteration in the message storage 45.

Figure 11:
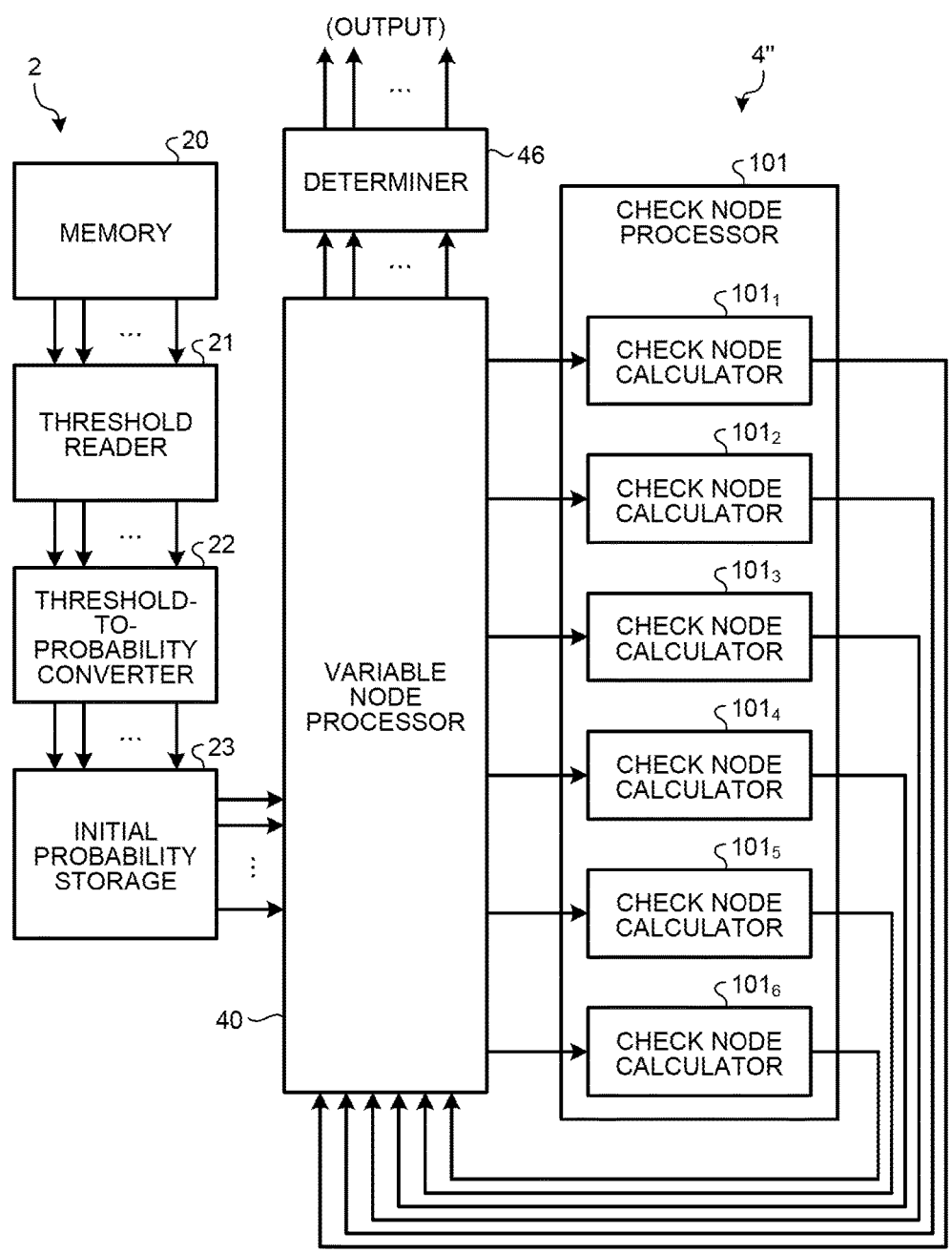
FIG. 11 is a block diagram illustrating an exemplary configuration of a decoding device using an existing technology.

FIG. 11 illustrates an exemplary configuration of a decoding device using an existing technology. In FIG. 11, parts that are the same as those in FIGS. 7 and 10 are assigned with the same reference numerals, and detailed explanations thereof are omitted herein. As illustrated in FIG. 11, in this decoder 4" using the existing technology, the check node processor 101 needs to have check node calculators $101_1$, $101_2$, ..., $101_6$ in the number corresponding to the number of check nodes predefined by the check matrix H (six, in this example).

The check node calculators $420_1$ to $420_4$ illustrated in FIG. 10 and the check node calculators $101_1$ to $101_6$ illustrated in FIG. 11 perform the operation of Equation (3) mentioned above. Equation (3) is an operation of calculating an infinite product, in which multiplications are performed in the number of times equal to the subtraction of one from the number of variable nodes, and a large circuit may be required depending on the number of variable nodes.

In the second embodiment, because the check node processing can be performed with check node calculators in the number smaller than the number of check nodes predefined by the check matrix H, the circuit for the check node processor can be downscaled, compared with the configuration using the existing technology. More specifically, assuming that the number of entire check nodes is C, and the average number of times the check node calculators perform the check node calculation based on Equation (3) in each iteration is L (where L<2×C), the configuration according to the second embodiment can reduce the number of check node calculators to a number smaller than C/L. Therefore, the configuration according to the second embodiment can downsize the circuit of the check node processor, compared with the existing configuration.

Third Embodiment

A third embodiment will now be explained. In the explanation above, the embodiments is used in the decoder 4 provided to the memory system 1 illustrated in FIG. 1, but the embodiments are not limited thereto. In other words, the embodiments may be used in a communication system transmitting and receiving data over a wired or wireless communication path.

Figure 12:
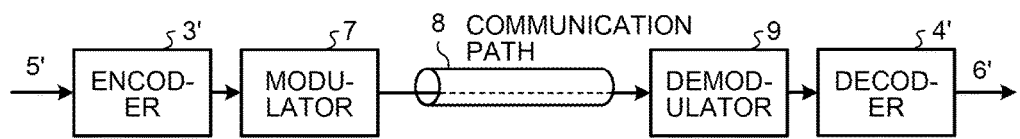
FIG. 12 is a schematic illustrating an exemplary configuration of a communication system that can be implemented with a third embodiment.

FIG. 12 illustrates an example of a configuration of a communication system that can be implemented in the third embodiment. With reference to FIG. 12, input data 5' is input to an encoder 3'. Then, the encoder 3' encodes the input data 5' into an LDPC code. A modulator 7 modulates the LDPC code in the encoded form according to a method suitable for a communication path 8, and sends the modulated code as a modulation signal to the communication path 8. A demodulator 9 receives the modulation signal sent through the communication path 8, demodulates the modulation signal as digital data, and sends the digital data to the decoder 4'. At that time, the demodulator 9 sends information related to the received signal to the decoder 4'. Based on the information related to the received signal as sent by the demodulator 9, the decoder 4' obtains the bit-by-bit probability value of the digital data sent by the demodulator 9. Then, based on the obtained probability values, the decoder 4' decodes the LDPC code in the manner described in each embodiment, and restores the input data 5'. Subsequently, the decoder 4' outputs the restored data as output data 6'.

In the manner described above, in the communication system that transmits and receives information over the communication path 8, the circuit of the check node processor that performs the check node processing in the LDPC decoding can be downscaled, compared with the existing configuration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A decoder comprising:
    a variable node processor configured to perform variable node processing on variable nodes defined by a code and output first messages;
    a check node processor configured to perform check node processing on check nodes defined by the code based on the first messages and output second messages;
    a distribution controller configured to control check nodes to which the first messages and the second messages are forwarded and to select one or more first messages to be excluded from an upcoming forwarding cycle;
    a memory configured to store one or more of the second messages;
    a first forwarder configured to forward, in accordance with the controlling by the distribution controller, one or more first messages remaining after excluding the selected messages to be forwarded to one or more check nodes corresponding to the one or more of the second messages having been stored in the memory, to the check node processor;

a second forwarder configured to forward the second messages to the variable node processor and forward, among the second messages, one or more messages designated by the distribution controller as the one or more of the second messages to the memory.

2. The decoder according to claim 1, wherein the check node processor performs the check node processing on check nodes in a number smaller than the check nodes defined by the code.

3. The decoder according to claim 1, wherein
the check node processor includes a plurality of check node calculators each performing the check node processing, and
the number of check node calculators included in the check node processor is less than C/L, where C is an integer of one or greater and a total number of the check nodes, and L is an average number of times the check node calculators perform the check node processing in a unit of a repetitive process in which the variable node processor and the check node processor perform the respective processes, and satisfies L<2×C.

4. The decoder according to claim 1, wherein a ratio of the number of one or more check nodes corresponding to the one or more of the second messages with respect to the total number of check nodes is equal to or less than (N−2)/N, where N is an average number of check nodes connected to each of the variable nodes and satisfies N>2.

5. The decoder according to claim 1, wherein the second forwarder forwards the one or more of the second messages to the memory, based on a set of check nodes that varies for each unit of a repetitive process performed by the variable node processor and the check node processor.

6. The decoder according to claim 5, wherein the second forwarder forwards the one or more of the second messages to the memory, based on a set of the check nodes sharing no common check nodes with other sets in successive units of the repetitive process.

7. The decoding device according to claim 5, wherein the second forwarder forwards the one or more of the second messages to the memory, based on a set of the check nodes that varies in such a manner that each of the one or more of the second messages is forwarded to the memory by an equal number of times when an increase in the number of repetitions, each performed in the unit of the repetitive process, reaches a limit.

8. A decoding method performed by a decoder, the method comprising:
performing variable node processing on variable nodes defined by a code to output first messages;
selecting one or more first messages to be excluded from an upcoming forwarding cycle;
performing check node processing on check nodes defined by the code based on the first messages to output second messages;
storing one or more of the second messages in a memory;
forwarding one or more first messages remaining after excluding the selected messages to be forwarded to one or more check nodes corresponding to the one or more of the second messages having been stored in the memory, to the check nodes;
forwarding the second messages to the variable nodes; and
forwarding, among the second messages, one or more messages designated as the one or more of the second messages to the memory.

9. A decoding method performed by a decoder, the method comprising:
storing, in a memory, one or more update values for one or more of check nodes in each unit of a repetitive process;
selecting at least one check node to be excluded from a subsequent unit of the repetitive process;
replacing update values for the at least one selected check node with the update values stored in the memory in the subsequent unit of the repetitive process; and
updating all of variable nodes every time check node processing is performed.

10. The decoding method according to claim 9, wherein a ratio of the one or more of the check nodes to have the update values replaced with the stored update values with respect to the number of the entire check nodes is equal to or less than (N−2)/N, where N is an average number of the check nodes connected to each of the variable nodes, and N is an integer larger than two.

11. The decoding method according to claim 9, wherein a different set of the one or more of the check nodes to have the update values replaced with the stored update values is used in each unit of the repetitive process.

12. The decoding method according to claim 11, wherein the set of the one or more of the check nodes to have the update values replaced with the stored updated values does not share any common check nodes with other sets in successive units of the repetitive process.

13. The decoding method according to claim 9, wherein the check nodes each have the update values replaced with the stored update values at an equal probability when an increase in the number of repetitions, each performed in the unit of the repetitive process, reaches a limit.

* * * * *